(12) United States Patent
Mickmann

(10) Patent No.: US 9,743,538 B2
(45) Date of Patent: Aug. 22, 2017

(54) CARRIER RAIL HOUSING

(71) Applicant: WAGO Verwaltungsgesellschaft mbH, Minden (DE)

(72) Inventor: Viktor Mickmann, Bielefeld (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 0 days.

(21) Appl. No.: 15/031,241

(22) PCT Filed: Oct. 16, 2014

(86) PCT No.: PCT/EP2014/072231
§ 371 (c)(1),
(2) Date: Apr. 21, 2016

(87) PCT Pub. No.: WO2015/059027
PCT Pub. Date: Apr. 30, 2015

(65) Prior Publication Data
US 2016/0286666 A1     Sep. 29, 2016

(30) Foreign Application Priority Data

Oct. 21, 2013   (DE) .................. 10 2013 111 551

(51) Int. Cl.
*H05K 5/00* (2006.01)
*H02B 1/052* (2006.01)
(Continued)

(52) U.S. Cl.
CPC ........... *H05K 5/0021* (2013.01); *H02B 1/052* (2013.01); *H02B 1/0523* (2013.01);
(Continued)

(58) Field of Classification Search
CPC .. H05K 5/0021; H05K 5/0017; H05K 5/0221; H05K 5/0204; H02B 1/0523; H02B 1/0526; H02B 1/052; H01R 9/2608
(Continued)

(56) References Cited

U.S. PATENT DOCUMENTS 5,602,363 A * 2/1997 Von Arx ................ H02B 1/052
174/559
5,716,241 A    2/1998 Hennemann et al.
(Continued)

FOREIGN PATENT DOCUMENTS

DE    44 02 002 B4    10/2005
EP    0 437 124 B1     9/1994
(Continued)

OTHER PUBLICATIONS

International Search Report for corresponding patent application No. PCT/EP2014/072342 dated Jan. 5, 2015.
(Continued)

*Primary Examiner* — Jinhee Lee
*Assistant Examiner* — Abhishek Rathod
(74) *Attorney, Agent, or Firm* — Renner, Otto, Boisselle & Sklar, LLP

(57) ABSTRACT

A carrier rail housing (1) is described comprising a snap-in base (2) for setting on a carrier rail (3). The snap-in base (2) comprises a carrier rail receiving opening (5) for receiving a carrier rail (3), two snap-in latches (4, 12) movable relative to each other comprising respectively at least one snap-in lug (6, 13), which protrude in a snap-in position into the carrier rail receiving opening (5) for locking with a carrier rail (3) receivable in the carrier rail receiving opening (5), and a coupling element (10) which is in operative connection with the two snap-in latches (4, 12) and transfers a movement of one snap-in latch (4) into a movement of the
(Continued)

Figure 1:
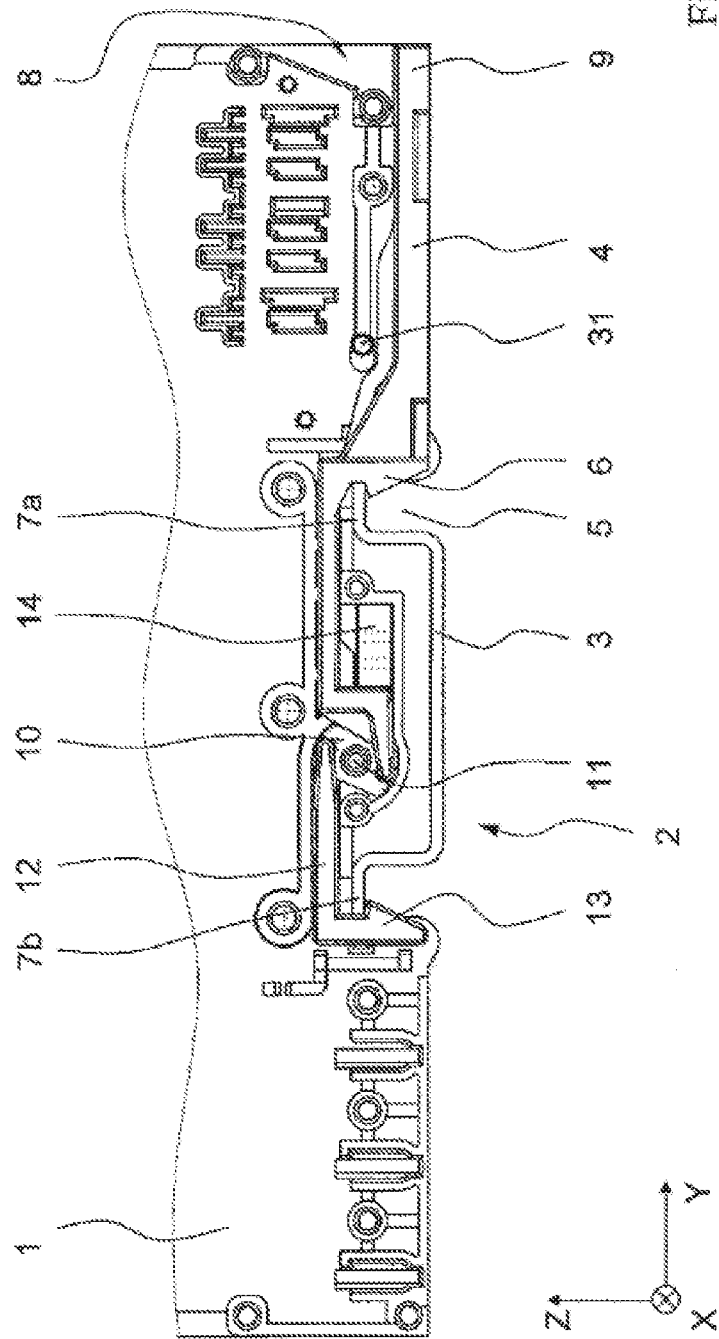

other snap-in latch (12). The snap-in base (2) further comprises a locking arm (15) with a stop (18) protruding into the carrier rail receiving opening (5) in an open position, in which the snap-in lugs (6, 13) are unlocked from the carrier rail (3), for applying at a side edge of the carrier rail (3) receivable in the carrier rail receiving opening (5). The locking arm (15) is in an operative connection with the snap-in latches (4, 12) in such a way that the snap-in latches (4, 12) are held in the open position by the application of the stop (18).

11 Claims, 5 Drawing Sheets

(51) Int. Cl.
  *H05K 5/02* (2006.01)
  *H01R 9/26* (2006.01)
(52) U.S. Cl.
  CPC ......... *H05K 5/0017* (2013.01); *H05K 5/0204* (2013.01); *H05K 5/0221* (2013.01); *H01R 9/2608* (2013.01); *H02B 1/0526* (2013.01)
(58) Field of Classification Search
  USPC ................ 439/532, 716; 361/807, 659, 664; 248/231.41
  See application file for complete search history.

(56) References Cited

U.S. PATENT DOCUMENTS

| 7,170,758 | B1 | | 1/2007 | Hanning et al. | |
|---|---|---|---|---|---|
| 7,516,927 | B2 | * | 4/2009 | Portal .................. | H01R 9/2608 248/221.11 |
| 2003/0143896 | A1 | * | 7/2003 | Bet ........................ | H02B 1/052 439/716 |
| 2014/0226287 | A1 | * | 8/2014 | V ........................... | H02B 1/052 361/747 |

FOREIGN PATENT DOCUMENTS

| EP | 1 742 315 A1 | | 1/2007 | | |
|---|---|---|---|---|---|
| EP | 2 003 754 B1 | | 11/2011 | | |
| ER | 0 978 913 B1 | | 8/1998 | | |
| IT | EP 2003754 B1 | * | 11/2011 | ........... | H01R 9/2608 |
| KR | WO 2004114466 A1 | * | 12/2004 | ........... | H01R 9/2408 |
| WO | 2004/114466 A1 | | 12/2004 | | |
| WO | 2013/054873 A1 | | 4/2013 | | |

OTHER PUBLICATIONS

International Preliminary Report on Patentability for corresponding patent application No. PCT/EP2014/072342 dated Apr. 26, 2016.

* cited by examiner

CARRIER RAIL HOUSING

This application is a national phase of International Application No. PCT/EP2014/072231 filed Oct. 16, 2014.

The invention relates to a carrier rail housing having a latching base for attaching to a carrier rail, wherein the latching base comprises:

a carrier rail receiving opening for receiving a carrier rail, two latching links that can move relative to one another having in each case at least one latching lug that in a latched position protrude into the carrier rail receiving opening so as to latch with a carrier rail that can be received in the carrier rail receiving opening, and a coupling element that is operatively connected to the two latching links and transfers a movement of one latching link into a movement of the other latching link.

Carrier rail housings of this type are used for electronic devices of varying types that are latched adjacent to one another onto a carrier rail, wherein the carrier rail is fastened to an assembly wall for example in a switch cabinet. In this manner, it is possible to arrange the wiring of electrical or electronic components, such as by way of example sensors, actuators and other devices. Carrier rail housings of this type are known in principle for example from DE 44 02 002 B4 for a modular control device.

EP 0 437 124 B1 discloses a carrier rail housing having two latching links that can move relative to one another and the latching lugs of said latching links engage below a carrier rail. The latching links are actuated by means of applying a tensile force to one of the latching links. The latching links can be fixed in an open position with the aid of a spring-loaded locking finger that acts upon the tensile force-actuated resilient link.

EP 2 003 754 B1 discloses a modular electrical device having a device for fixedly clamping to a carrier rail. Two movable sliders having a simultaneous actuating mechanism are provided so as to move between an extended position and a retracted position. The simultaneous actuating mechanism causes an actuation of the second slider as the first slider is actuated. The simultaneous actuating mechanism comprises an elastic member for sliding the second slider into the extended position and a rotating sliding member for rotating about a rotary shaft and for exerting a sliding force that counteracts the force of the resilient member in order to bring the second slider from the extended position into the retracted position. Holding recesses are provided so as to fix the slider in the extended or retracted position, said holding recesses cooperating with a holding lug.

EP 1 742 315 A1 discloses a modular housing for latching onto a carrier rail having two locking sliders that can be displaced relative to one another, said locking sliders being connected to one another by way of a resilient element and in each case comprising sections for latching below carrier rail edges (latching lugs). An expanding pin that can be rotated with the aid of a screwdriver extends in a perpendicular manner through two locking sliders so that when the expanding pin rotates, an alternative movement of the locking sliders with respect to one another is caused so as to open or close the latching base.

Furthermore, EP 0 978 913 B1 discloses a clamping device as a component of a device housing that can be assembled on a carrier rail and comprises a housing guiding arrangement for receiving the carrier rail. Holding lugs are provided on the two sides of the housing guiding arrangement and in the closed position said holding lugs protrude into the housing guiding arrangement in such a manner that said holding logs engage around the profile edge of the carrier rail in a positive-locking manner. It is possible by means of a common slider to displace each holding lug into an open position that is retracted from the device guiding arrangement, wherein the holding lug can be formed on the common slider as one part and can be deformed in an elastic manner. The slider is latched in the open position by means of a latching lever on a housing stop.

WO 2004/114466 A1 discloses a carrier rail housing having a latching base for attaching to a carrier rail, wherein two latching links that can move relative to one another having in each case at least one latching lug are coupled to one another by way of a rotating coupling element that is mounted in such a manner that it can rotate in the direction of extension of the carrier rail so that a movement of the one latching link is converted into a movement of the other latching link and the latching links having the associated latching lugs can thereby be moved relative to one another.

WO 2013/054873 A1 discloses a carrier rail housing having a latching base that has two latching links having latching lugs and said latching links can move relative to one another. The latching links are coupled to one another by way of a resilient arm in order to guide said latching links into the latched position. A locking arm is provided on at least one latching link, said locking arm cooperating with the housing in order to hold the latching link in the end position of the open position and latched position.

The latching link is actuated using a rocking lever that is attached to the latching link by way of a rocking arm that is formed on the latching link in an elastic manner. The latching link that can be influenced by way of the rocking lever is placed under pre-stressing in the open state with the aid of a compression spring (coil spring) that acts between the device housing and the latching link.

Based on this, the object of the present invention is to provide an improved carrier rail housing having a latching base for attaching to a carrier rail, wherein the latching links are held in the simplest manner possible in the open position with their latching lugs in an open position in which the latching lugs are unlatched from the carrier rail.

The object is achieved by virtue of the carrier rail housing having the features of claim 1. Advantageous embodiments are described in the dependent claims.

It is proposed that the latching base furthermore comprises a locking arm having a stop that protrudes into the carrier rail receiving opening in an open position, in which the latching lugs are unlatched from the carrier rail, so as to make contact with a side edge of the carrier rail that can be received in the carrier rail receiving opening. The locking arm is operatively connected to the latching links in such a manner that the latching links are held in the open position by means of making contact with the stop.

The additional locking arm renders it possible in a constructively simple and space-saving manner together with a particularly simple handling operation to fix the latching links in this open position after a relative movement of the latching links into the open position. For this purpose, the stop of the locking arm makes contact with one side edge of a carrier rail that can be received in the carrier rail receiving opening so that the latching links are positionally fixed in the open position with the aid of this stop. The carrier rail housing can be subsequently easily removed from the carrier rail without it being necessary to otherwise forcibly hold the latching links open.

After the carrier rail housing has been removed from the carrier rail, the stop of the locking arm is disengaged from the carrier rail and releases the latching links. For the case that the latching links are under pre-stressing, for example by means of a resilient element, the latching links slide back into the latched position. However, this is no longer disadvantageous since the open position is no longer required in the state in which the carrier rail housing is removed from the carrier rail.

The locking arm is preferably embodied in an elastically resilient manner. It is particularly advantageous if the locking arm is formed as one in an integral manner, in other words as one part, on one of the latching links. It is thus possible for the locking arm by way of example in a space-saving manner to extend adjacent to or where required in part above the allocated latching link.

It is possible by means of the integral embodiment of the locking arm with a latching link for the locking mechanism to be produced in a simple and cost-effective manner together with the injection molding process of the latching link without an additional space requirement and without requiring an additional expenditure for the assembly procedure.

It is particularly advantageous if the carrier rail housing and the locking arm comprise guiding contours that are coordinated with one another and lie one on top of the other. The guiding contours are embodied so as to displace the stop from a first region that lies between a carrier rail, which is integrated into a carrier rail receiving opening, and the base of the carrier rail receiving opening, into a second region that lies between a side wall of the carrier rail receiving opening and a side edge of the carrier rail if the latching lugs of the two latching links are moved away from one another from the latched position into the open position.

The section of the locking arm that comprises the stop is thereby used in the open position for the purpose of holding the latching base in the open position by means of making contact with a side edge of the carrier rail as it is displaced into the second region. In contrast, in the latched position, the region of the locking arm that comprises the stop is displaced into the first region between the carrier rail housing and an upper face of the carrier rail.

The corresponding displacement of the end section of the locking arm that comprises the stop is achieved by means of the guiding contours. In the case of a relative movement of the latching links with respect to one another, the end section of the locking arm is consequently displaced in a defined manner with the aid of the locking contours from the first region into the second region and vice versa.

In a further preferred embodiment, the coupling element is embodied as a rotating disc that is mounted in such a manner that it can rotate about a rotary shaft that extends in the direction of extension of a carrier rail that can be received in the carrier receiving opening. The latching links are connected in an articulated manner to one another lying on opposite sides of the rotating disc with the rotary shaft that lies between said latching links. As a latching link is displaced, the rotating disc that is connected in an articulated manner thereto is consequently caused to rotate about the rotary shaft. This leads to the other latching link likewise being displaced relative to the actuated latching link. In the case of this embodiment, it is not necessary for the latching links to be connected in an articulated manner directly to one another on opposite sides of the rotating disc, in other words diametrically opposite (180° offset), even if this is particularly advantageous. It is feasible that the latching links are offset by more than 180° with respect to one another but are attached to the rotary shaft on opposite sides of the rotating disc relative to the rotary shaft.

The latching links advantageously have in each case an inclined surface that extends at an acute angle with respect to the opening plane of the carrier rail receiving opening. The opening plane of the carrier rail receiving opening is the opening plane through which a carrier rail is guided into the carrier rail receiving opening. With the aid of this inclined surface, it is also possible to attach the carrier rail housing to a carrier rail in the latched position of the latching links without having to previously displace the latching links into the open position. When attaching the carrier rail housing to the carrier rail, a force is exerted onto the latching links by means of the inclined surfaces and said force move the latching links relative to one another in such a manner that the latching lugs that lie opposite one another are driven apart in the direction towards the open position. Since the open position is only reached to the extent that the pointed ends of the latching lugs can just glide along the side edges of the carrier rail, the stop of the locking arm in the case of attaching the carrier rail housing in this manner cannot be automatically brought into contact with the side edge of the carrier rail in order to hold the latching links in the open position during the attachment procedure. It is therefore not necessary to manually actuate the locking arm in any manner. The locking arm consequently only functions when manually opening the latching links from the latched position into the open position and also in turn without it being necessary to manually lock the locking arm itself.

The carrier rail housing has preferably at least one circuit board having an electronics system and having at least one plug element having conductor connecting contacts for connecting electrical conductors and said plug element can be connected in an electrically conductive manner to the circuit board. It is particularly advantageous if the carrier rail housing is an electronic module device of a modular control device. It is thus possible to embody the carrier rail housing by way of example as a field bus controller having a computer unit for performing a control program, a field bus coupler or I/O modules that are connected to field bus controllers or field bus couplers of this type. I/O modules of this type can be input modules for capturing input signals for example from sensors, output modules for outputting signals for example to actuators that are connected, motor control modules, interface modules (for example RS232/RS434, USB etc.) or other modules. It is advantageous if the carrier rail housings have plug contacts on at least one side edge in order when arranging the carrier rail housings in rows to automatically establish a data bus, a system voltage supply and/or an electrical power supply for the connected components of the bus when attaching a carrier rail housing to a carrier rail.

Figure 2:
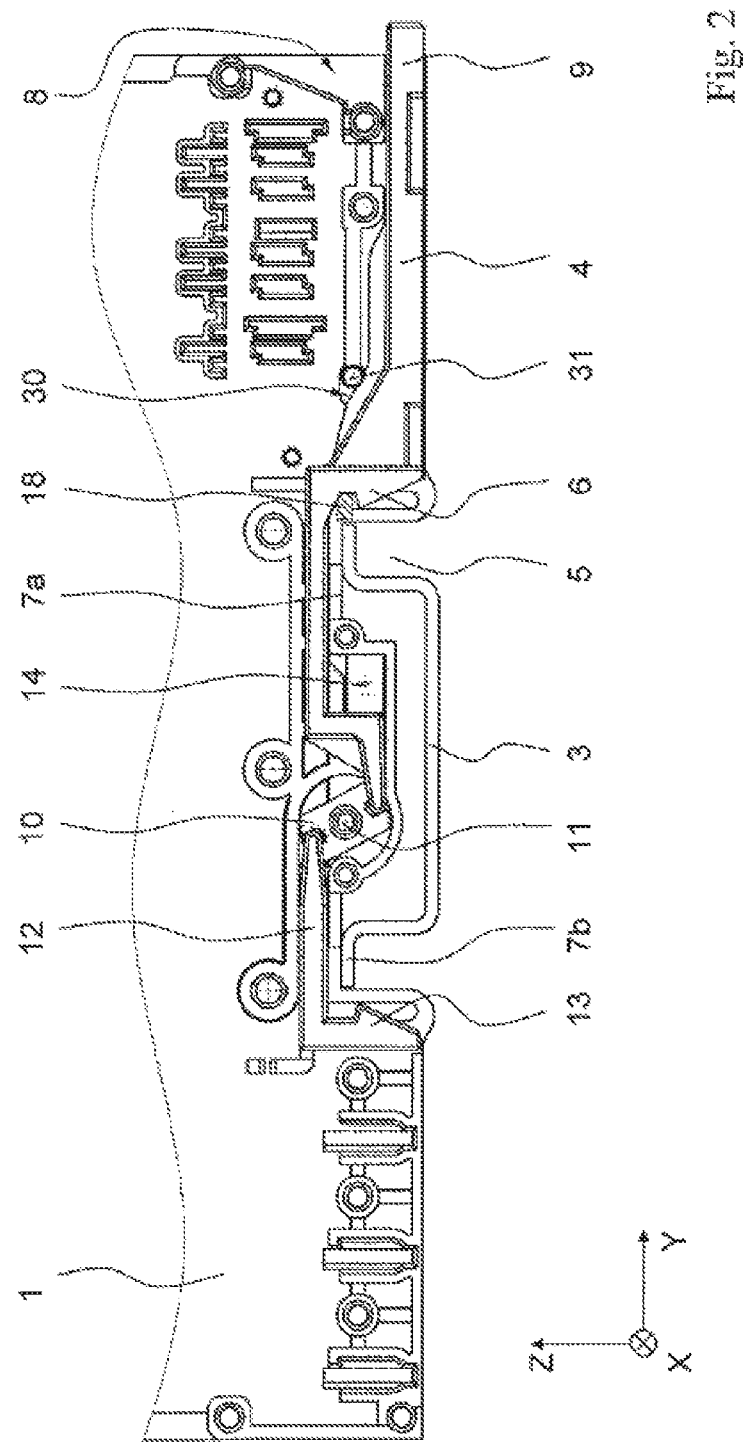
Figure 3:
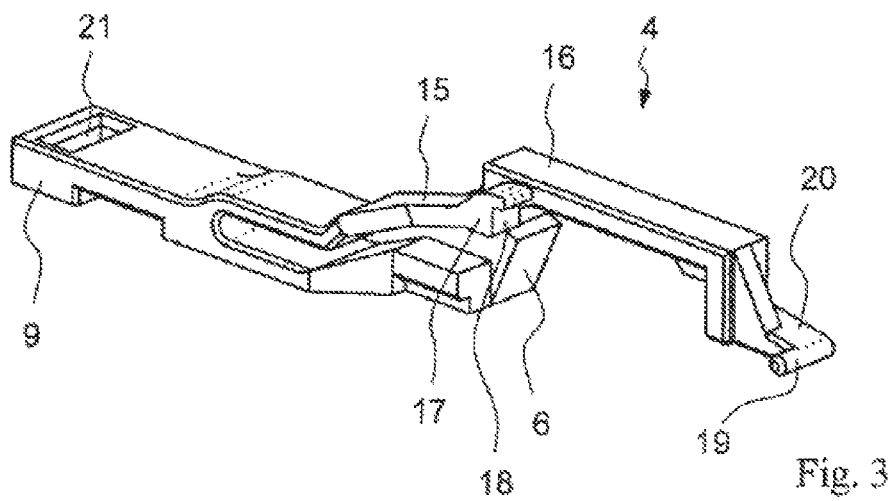
Figure 4:
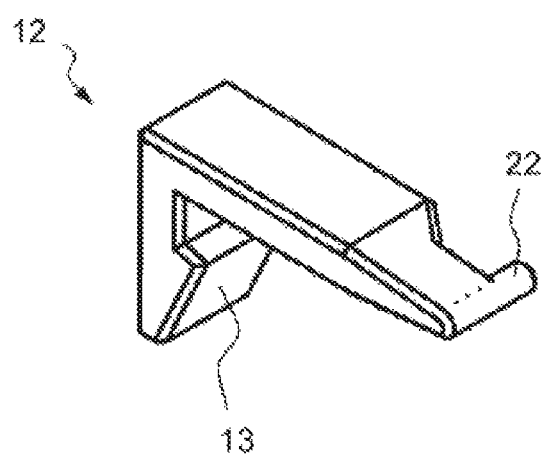
Figure 5:
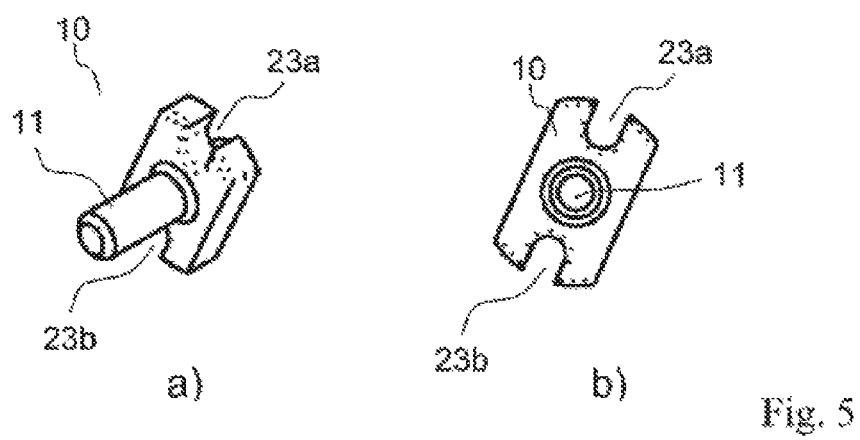
Figure 6:
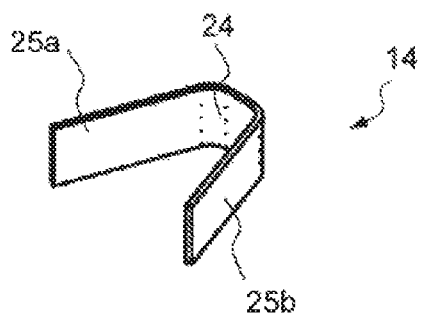
Figure 7:
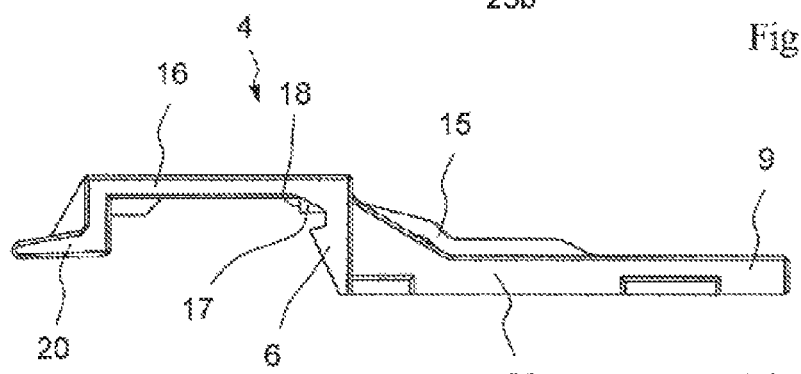
Figure 8:
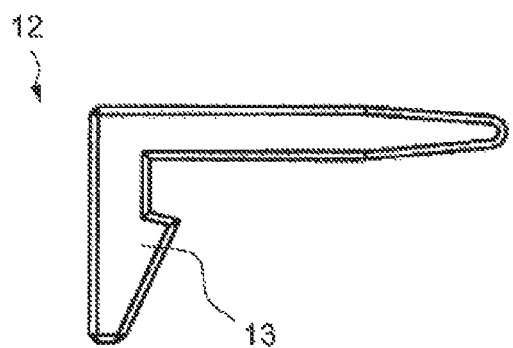
Figure 9:
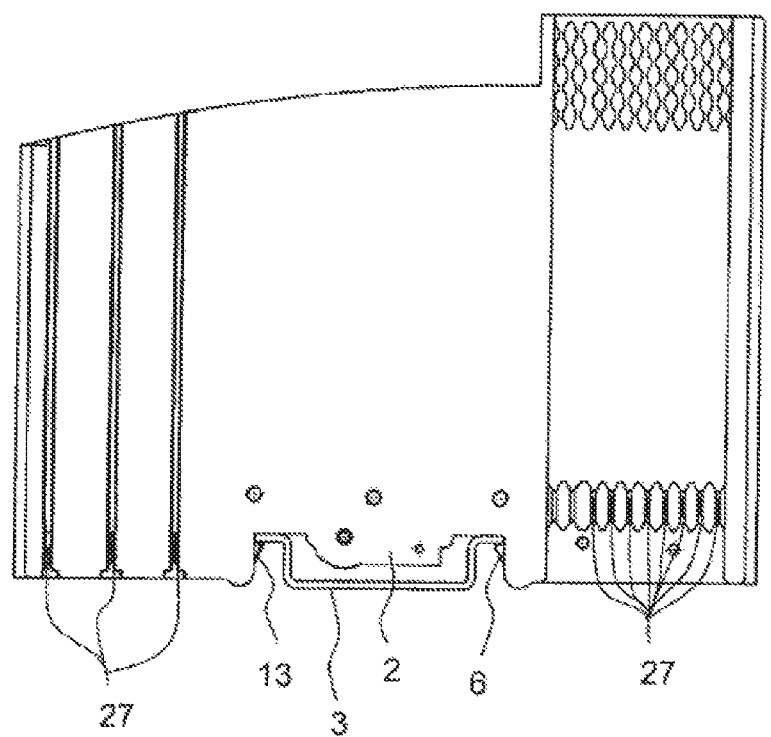

The invention is further explained hereinunder with reference to an exemplary embodiment and the attached drawings. In the drawings:

FIG. 1—illustrates a side sectional view of a carrier rail housing in the region of the latching base in the latched position, FIG. 2—illustrates a side sectional view of a carrier rail housing in FIG. 1 in the region of the latching base in the open position, FIG. 3—illustrates a perspective view of a first latching link of the latching base having a locking arm that is formed on said latching base, FIG. 4—illustrates a perspective view of the second latching link, FIG. 5—illustrates a perspective view of the coupling element that is embodied as a rotating disc, FIG. 6—illustrates a perspective view of a U-shaped resilient element for influencing the first latching link with a force, FIG. 7—illustrates a side view of the first latching link FIG. 8—illustrates a side view of the second latching link, FIG. 9—illustrates a side view of the entire carrier rail housing.

FIG. 1 illustrates an embodiment of a carrier rail housing 1 in the side view in the section of a latching base 2 with which the carrier rail housing 1 is attached and latched to a carrier rail 3. The latching base 2 comprises a first latching link 4 that extends from a first side edge (in the image, the right-hand side edge) into a carrier rail receiving opening 5. The first latching link 4 comprises a latching lug 6 that likewise points into the carrier rail receiving opening 5 in order to latch in the illustrated latched position on a side edge of the carrier rail 3 and to engage below a folded longitudinally extending connecting piece 7a of the carrier rail 3. An actuating opening 8 that extends in an inclined manner in the carrier rail housing 1 that is embodied from insulating material is provided on the side wall of the carrier rail housing 1 and the first latching link 4 protrudes out of said side wall. An actuating tool, for example a screwdriver, can thereby be inserted into the actuating opening 8 and can be brought into an operative connection with the free end 9 of the latching link 4 in order to displace the latching link 4 from the illustrated latched position into an open position.

A coupling element 10 that is mounted in such a manner that it can rotate is connected in an articulated manner to the free end of the latching link 4 that lies opposite the free actuating end 9. For this purpose, a finger that starts from the latching link 4 engages in a corresponding mounting opening of the coupling element 10. The coupling element 10 is embodied as a rotating disc that is mounted about a rotary shaft 11 that extends in the direction of extension X of the carrier rail 3 and is arranged on the carrier rail housing 1 or the latching base 2.

A second latching link 12 is connected in an articulated manner to the coupling element 10. This coupling element 10 is likewise mounted in a mounting opening of the coupling element 10 with a finger that extends in a transverse manner with respect to the second latching link 12. The second latching link 12 is formed in an L-shaped manner and likewise has on its free end a latching lug 13 for latching on the second side edge 7b of the carrier rail 3, said side edge extending longitudinally in the direction X.

The first and second latching links 4, 12 extend essentially parallel to one another and are mounted in such a manner that they can move relative to one another in such a manner that the latching lugs 6, 13 are moved away from one another on a constant plane in the case of the latching link 4 being in part pulled out of the illustrated latched position into the open position that is sketched in FIG. 2.

The open position can be identified in FIG. 2 and in said open position, the first latching link 4 protrudes with its free actuating end 9 in part out of the side wall of the carrier rail housing 1. The coupling element 10 rotates about the rotary shaft 11 and said rotation moves the second latching link 12 with its latching lug 13 away from the latching lug 6 of the first latching link 4. As a consequence, the latching lugs 6 and 13 are moved so far apart from one another that said latching lugs are disengaged from the respective side edge of the carrier rail 3 or the side connecting pieces 7a, 7b that extend longitudinally. The latching base 2 is thereby unlatched and the carrier rail housing 1 can be removed from the carrier rail 3.

Furthermore, a resilient element 14 is evident in FIGS. 1 and 2, said resilient element being arranged between the carrier rail housing 1 that is formed from insulating material and an L-shaped angled region of the first latching link 4. In the latched position in accordance with FIG. 1, the resilient element 14 is relaxed or the resilient arms of the U-shaped bent leaf spring that lie opposite one another are further spaced from one another than in the open position in accordance with FIG. 2. At that location, the resilient element 14 is stressed by means of in part pulling out the first latching link 4 by means of pressing the resilient arms that lie opposite one another together. This leads to the first latching link 4 being automatically guided back into the latched position under the force of the resilient element 14 (leaf spring) when releasing the first latching link 4.

In order to hold the latching base 2 automatically in the open position that is illustrated in FIG. 2, the first latching link 4 comprises a locking arm 15 that is evident in FIG. 3. This locking arm 15 extends adjacent to the connecting piece 16 of the latching link 4, said connecting piece supporting the latching lug 6, and starts from the first actuating end 9 in the direction of extension that points towards the latching lug 6. It is clear that the locking arm 15 is embodied as one part, in other words in an integral manner with the first latching link 4 for example by means of an injection molding procedure from a synthetic material and as a consequence behaves in an elastically resilient manner. The free end of the locking arm 15 has an approximately cuboid-shaped head 17 having an L-shaped recess when viewed in the cross section for forming a stop 18. When engaged with the side edge of the first side connecting piece 7a, this stop 18 reaches a carrier rail 3 that is received in the carrier rail receiving opening 5 if the open position that is illustrated in FIG. 2 is achieved. In this manner, the first latching link 4 and thereby also the second latching link 12 that is coupled thereto by way of the coupling element 10 are prevented from being pushed back in a resilient manner into the latched position in accordance with FIG. 1 if the first latching link 4 is released.

The locking arm 15 comprises a guiding contour on the locking arm side in the form of an inclined surface 30 on the upper face of the locking arm 15. The carrier rail housing 1 comprises an allocated guiding contour on the housing side in the form of a pin 31 that is arranged fixed to the carrier rail housing 1. When in part pulling out the first latching link 4, the guiding contour on the locking arm side (in other words the inclined surface 30) lies on the guiding contour on the housing side (in other words on the pin 31). The locking arm 15 is pressed downwards in the direction towards the latching lug 6 and side edge of the carrier rail 3 by means of these guiding contours that are coordinated with one another. After removing the carrier rail housing 1 from the carrier rail 3, this locking arrangement of the latching base 2 is disconnected by means of the stop 18 and the first and second latching links 4, 12 can then slide in the direction towards one another under the force of the leaf spring 14 in order to reach the latched position.

In the illustrated embodiment, the fixed pin 31 that is on the carrier rail side slides on the inclined surface 30 on the upper face of the locking arm 15 and forces said locking arm into a deflecting movement for the open position. An alternative embodiment is feasible in so far as that the locking arm 15 is deflected upwards and pre-stressed in an elastically resilient manner during the latching procedure if the head 17 comes into contact with the carrier rail edge. During the opening movement of the latching links 4, 12, the locking arm 15 will then snap back in the case of a sufficiently wide open position so that the stop 18 can be brought into contact.

When attaching the carrier rail housing 1 to the latching base 2 that is in the latched position, the latching lugs 6, 13 are moved away from one another owing to their tapered shape having an inclined surface that extends at an acute angle with respect to the opening plane of the carrier rail receiving opening 5 or with respect to the plane that extends through the carrier rail 3 or with respect to the plane that extends through the base of the carrier rail housing 1 if the latching lugs 6, 13 lie on the side edges of the side connecting pieces 7a, 7b. An actuating procedure for opening the latching base 2 into the open position is not required when attaching the carrier rail housing 1 to a carrier rail 3.

FIG. 3 further illustrates the spigot 19 on the free joint end 20 of the first latching link 4 that lies opposite the free actuating end 9. This spigot 19 protrudes in a transverse manner from the connecting piece 16 that extends from the latching base 6 in the direction towards the free joint end 20.

Furthermore, it is clear that an actuating opening 21 is present on the free actuating end 9. It is possible to insert a screwdriver or another suitable actuating tool into this actuating opening 21 in order to displace the first latching link 4 by means of a lever force provided by the screwdriver on the carrier rail housing 1.

FIG. 4 illustrates a perspective view of the L-shaped second latching link 12. It is clear that a latching lug 13 that extends in an inclined manner is provided on a free end, said latching lug extending in the direction towards the other end. The latching lug 13 is arranged on the short arm of the L-shaped latching link 12. A finger 22 that protrudes in a transverse manner is likewise provided on a free end of the long arm and said finger is inserted in a corresponding mounting opening of the coupling element 10.

FIG. 5 illustrates in the part figure a) a perspective view and in the part figure b) a side view of the coupling element 10. It is clear that mounting openings 23a, 23b are present on the two sides of the rotary shaft 11. These mounting openings 23a, 23b lie diametrically opposite one another in the illustrated exemplary embodiment. Optionally, these mounting openings can also be offset with respect to one another on sides of the rotary shaft 11 that lie opposite one another.

FIG. 6 illustrates a perspective view of the U-shaped curved leaf spring 14. It is clear that the leaf spring 14 comprises two resilient arms 25a, 25b that extend from a common resilient curve 24. Alternatively, it is also possible for a compression spring for example in the form of a coil spring or similar to be provided.

FIG. 7 illustrates a side view of the first latching link 4. It is clear that the first latching link 4 having a first connecting piece 26 extends from the actuating end 9. The latching link 6 that extends in an inclined manner is present on the end of the first connecting piece 26. Parallel to this, the locking arm 15 extends so that the head 17 lies on the free end of the locking arm 15 having the stop 18 below the second connecting piece 16. It is clear that the stop 18 protrudes from the actuating end 9 to 10 somewhat further than the point end of the latching lug 6. The stop 18 is thereby prevented from engaging with the side edge of the carrier rail 3 and the latching base 2 holds in the open position when attaching the carrier rail housing 1 to the carrier rail 3. Only after opening the first latching link 4 into the open position to such an extent that the latching lug 6 disengages from the side connecting piece 7a of the carrier rail 3 is the stop 18 guided past on the side edge of the side connecting piece 7a of the carrier rail 3 and can finally lie on the side edge of the side connecting piece 7a in order to hold the latching base 2 in the open position.

Furthermore, it is clear that the second connecting piece 16 is in turn angled in the direction towards the free end in an L-shaped manner and transitions into the joint end 20 with a further L-shaped angle.

FIG. 8 illustrates a side view of the second locking link 12 that is formed in an L-shaped manner. Essentially, it is possible to refer to the description of FIG. 4.

FIG. 9 illustrates a side view of the carrier rail housing 1 that is embodied in the illustrated embodiment as a one part insulating-material housing having a latching base 2 that is integrated into said insulating material housing. Alternatively, it is possible to provide a multiple-part insulating housing having a base part that comprises the latching base 2, an electronics module that can be attached to said insulating housing, and a plug connector module having plug contacts for connecting electrical conductors and said plug connector module can be attached to the electronics module. It is clear that a number of plug contacts 27 are present on the side surfaces of the carrier rail housing 1. With the aid of the plug contacts 27 that are illustrated on the right-hand side of the image, it is possible to establish a data bus and a system voltage supply when arranging a plurality of carrier rail housings 1 in rows on a carrier rail 3. With the aid of the plug contacts 27 that are illustrated on the left-hand side, it is possible to provide a power supply for bus components that are connected to the carrier rail housing 1 or on to the hereby formed electrical devices, such as by way of example actuators, sensors or similar. It is not necessary to also use the consequently looped power supply of each carrier rail housing 1.

The invention claimed is:

1. A carrier rail housing having a latching base for attaching to a carrier rail, wherein the latching base comprises
   a carrier rail receiving opening for receiving the carrier rail,
   two latching links that can move relative to one another having in each case at least one latching lug that protrudes in a latched position into the carrier rail receiving opening so as to latch with the carrier rail that can be received in the carrier rail receiving opening, and
   a coupling element that is operatively connected to the two latching links and a movement of one latching link is transferred into a movement of the other latching link, characterized in that the latching base furthermore comprises a locking arm having a stop that protrudes into the carrier rail opening in an open position, in which the latching lugs are unlatched from the carrier rail, so as to make contact with a side edge of the carrier rail that can be received in the carrier rail receiving opening, wherein the locking arm is operatively connected to the latching links in such a manner that the latching links are held in the open position by means of the stop making contact.

2. The carrier rail housing as claimed in claim 1, characterized in that the locking arm is formed with one of the latching links in an integral manner.

3. The carrier rail housing as claimed in claim 1, characterized in that the locking arm is elastically resilient.

4. The carrier rail housing as claimed in claim 1, characterized in that a resilient element is operatively connected between the carrier rail housing and at least one of the latching links in order to return the latching links under resilient force of the resilient element from an open position in the direction towards the latched position.

5. The carrier rail housing as claimed in claim 1, characterized in that the carrier rail housing and the locking arm comprise guiding contours that are coordinated with one another and lie one on top of the other, wherein the guiding contours are embodied so as to displace the stop from a first region that lies between the carrier rail that is introduced into the carrier rail receiving opening, and the base of the carrier rail receiving opening into a second region that lies between a side wall of the carrier rail receiving opening and a side edge of the carrier rail if the latching lugs of the two latching links are moved away from one another from the latched position into the open position.

6. The carrier rail housing as claimed in claim 1, characterized in that the stop of the locking arm is arranged on a support that can be positioned in the latched position between the carrier rail and the base of the carrier rail receiving opening.

7. The carrier rail housing as claimed in claim 1, characterized in that the coupling element is a rotating disc that is mounted in such a manner that it can rotate about a rotary shaft that extends in the direction of extension of the carrier rail that can be received in the carrier receiving opening, wherein the latching links are connected in an articulated manner to one another lying on opposite sides of the rotating disc with the rotary shaft that lies between said latching links.

8. The carrier rail housing as claimed in claim 7, characterized in that the latching links are connected in an articulated manner to the rotating disc and lie diametrically opposite one another.

9. The carrier housing as claimed in claim 1, characterized in that the latching lugs in each case have an inclined surface that extends at an acute angle with respect to the opening plane of the carrier rail receiving opening.

10. The carrier rail housing as claimed in claim 1 having at least one circuit board and electronics system and having at least one plug element having conductor connecting contacts for connecting electrical conductors and said plug element can be connected in an electrically conductive manner to the circuit board.

11. The carrier rail housing as claimed in claim 10, characterized in that the carrier rail housing is a device module of a modular control device, in particular an input module, an output module, a motor control module, an interface module, a field bus coupler or field bus controller having a computer unit for implementing a control program.

* * * * *